(12) United States Patent
Lai et al.

(10) Patent No.: US 10,446,539 B2
(45) Date of Patent: Oct. 15, 2019

(54) ELECTROSTATIC DISCHARGE (ESD) PROTECTION DEVICE AND METHOD FOR OPERATING AN ESD PROTECTION DEVICE

(71) Applicant: NXP B.V., Eindhoven (NL)

(72) Inventors: Da-Wei Lai, Nijmegen (NL); Wei-Jhih Tseng, Nijmegen (NL)

(73) Assignee: NXP B.V., Eindhoven (NL)

( * ) Notice: Subject to any disclaimer, the term of this patent is extended or adjusted under 35 U.S.C. 154(b) by 262 days.

(21) Appl. No.: 15/441,579

(22) Filed: Feb. 24, 2017

(65) Prior Publication Data

US 2018/0247928 A1    Aug. 30, 2018

(51) Int. Cl.
   *H02H 9/00* (2006.01)
   *H01L 27/02* (2006.01)
   *H02H 9/04* (2006.01)

(52) U.S. Cl.
   CPC ...... *H01L 27/0262* (2013.01); *H01L 27/0255* (2013.01); *H01L 27/0259* (2013.01); *H02H 9/04* (2013.01)

(58) Field of Classification Search
   CPC .............................. H01L 27/0262; H02H 9/04
   USPC .................................................. 361/56, 111
   See application file for complete search history.

(56) References Cited

U.S. PATENT DOCUMENTS

| | | | |
|---|---|---|---|
| 6,064,249 A | 5/2000 | Duvvury et al. | |
| 9,153,571 B1* | 10/2015 | Chen | H01L 27/0251 |
| 2006/0006498 A1* | 1/2006 | Dutta | H01L 29/0692 |
| | | | 257/571 |
| 2013/0234209 A1* | 9/2013 | Parthasarathy | H01L 27/0262 |
| | | | 257/197 |
| 2015/0085407 A1 | 3/2015 | Chen et al. | |
| 2015/0236009 A1 | 8/2015 | Gill et al. | |
| 2016/0336744 A1 | 11/2016 | Parthasarathy et al. | |

FOREIGN PATENT DOCUMENTS

| | | |
|---|---|---|
| EP | 3001457 A1 | 3/2016 |
| EP | 3107122 A1 | 12/2016 |

OTHER PUBLICATIONS

U.S. Appl. No. 15/006,821, filed Jan. 26, 2016.
Mergens, Markus P.J. et al.; "ESD Protection Considerations in Advanced High-Voltage Technologies for Automotive"; ESDA, 10 pages; 2006.

* cited by examiner

*Primary Examiner* — Thienvu V Tran
*Assistant Examiner* — Lucy M Thomas

(57) ABSTRACT

Embodiments of an electrostatic discharge (ESD) protection device and a method for operating an ESD protection device are described. In one embodiment, an ESD protection device includes three or more bipolar transistors that are configured to shunt current between a first node and a second node in response to an ESD pulse received between the first and second nodes and a diode connected in series with the three or more bipolar transistors and one of the first and second nodes. Each of the three or more bipolar transistors includes a collector comprising collector components, an emitter comprising emitter components, and a base structure comprising a substrate region or an active region. The emitter components are alternately located with respect to the collector components. The substrate region or the active region surrounds the collector components and the emitter components. Other embodiments are also described.

20 Claims, 8 Drawing Sheets

ELECTROSTATIC DISCHARGE (ESD) PROTECTION DEVICE AND METHOD FOR OPERATING AN ESD PROTECTION DEVICE

Embodiments of the invention relate generally to electronic hardware and methods for operating electronic hardware, and, more particularly, to electrostatic discharge (ESD) protection devices and methods for providing ESD protection.

Electrostatic discharge is a sudden flow of electricity that can be caused by a buildup of static electricity. An ESD protection device can be used to shunt ESD current to prevent thermal damage in a device. For example, an ESD protection device can be integrated onto an electrical device, such as an integrated circuit (IC) chip, to provide a low impedance channel to prevent thermal damage to components of the electrical device. The operating characteristics of an ESD protection device (e.g., the trigger voltage at which the ESD protection device is activated to shunt ESD current and the snapback holding voltage at which a breakdown condition occurs in the ESD protection device) can affect the performance of the ESD protection device.

SUMMARY

Embodiments of an ESD protection device and a method for operating an ESD protection device are described. In one embodiment, an ESD protection device includes three or more bipolar transistors that are configured to shunt current between a first node and a second node in response to an ESD pulse received between the first and second nodes and a diode connected in series with the three or more bipolar transistors and one of the first and second nodes. Each of the three or more bipolar transistors includes a collector including collector components, an emitter including emitter components, and a base structure including a substrate region or an active region. The emitter components are alternately located with respect to the collector components. The substrate region or the active region surrounds the collector components and the emitter components. Other embodiments are also described.

In an embodiment, the base structure includes the substrate region. The base structure further includes base contacts located at corners of the base structure.

In an embodiment, the base structure includes the substrate region. The base structure further includes only four base contacts. Each of the four base contacts is located at a different corner of the base structure.

In an embodiment, the base structure includes the substrate region and the active region. The active region is located vertically with respect to the substrate region. The base structure includes no base contact.

In an embodiment, the base structure includes the substrate region. The base structure includes no base contact and no active region.

In an embodiment, the three or more bipolar transistors are connected in series between the first and second nodes.

In an embodiment, the three or more bipolar transistors include PNP bipolar transistors.

In an embodiment, the ESD protection device further includes a second active region that physically separates the three or more bipolar transistors and the diode.

In an embodiment, the diode and one of the three or more bipolar transistors operate as a silicon controlled rectifier (SCR).

In an embodiment, the diode and the one of the three or more bipolar transistors share a substrate layer.

In an embodiment, an ESD protection device includes three or more PNP bipolar transistors connected in series that are configured to shunt current between a first node and a second node in response to an ESD pulse received between the first and second nodes and a diode connected in series with the three or more bipolar transistors and one of the first and second nodes. Each of the three or more PNP bipolar transistors includes a collector including collector components, an emitter including emitter components alternately located with respect to the collector components, and a base structure including a substrate region or an active region. The substrate region or the active region surrounds the collector components and the emitter components. The diode and one of the three or more PNP bipolar transistors operate as an SCR.

In an embodiment, the base structure includes the substrate region. The base structure further includes base contacts located at corners of the base structure.

In an embodiment, the base structure includes the substrate region. The base structure further includes only four base contacts. Each of the four base contacts is located at a different corner of the base structure.

In an embodiment, the base structure includes the substrate region and the active region. The active region is located vertically with respect to the substrate region. The base structure includes no base contact.

In an embodiment, the base structure includes the substrate region. The base structure includes no base contact and no active region.

In an embodiment, the ESD protection device further includes a second active region that physically separates the three or more bipolar transistors and the diode.

In an embodiment, a method for operating an ESD protection device including three or more bipolar transistors and a diode connected in series with the three or more bipolar transistors involves receiving an ESD pulse at the ESD protection device, in response to the ESD pulse, enabling an embedded silicon controlled rectifier (eSCR) component that includes a combination of a particular bipolar transistor from the three or more bipolar transistors and the diode, and conducting an ESD current from the ESD pulse through the three or more bipolar transistors and the diode. The particular bipolar transistor includes a collector including collector components, an emitter including emitter components alternately located with respect to the collector components, and a base structure including a substrate region or an active region. The substrate region or the active region surrounds the collector components and the emitter components.

In an embodiment, the base structure includes the substrate region. The base structure further includes base contacts located at corners of the base structure.

In an embodiment, the base structure includes the substrate region and the active region. The active region is located vertically with respect to the substrate region. The base structure includes no base contact.

In an embodiment, the base structure includes the substrate region. The base structure includes no base contact and no active region.

Other aspects and advantages of embodiments of the present invention will become apparent from the following detailed description, taken in conjunction with the accompanying drawings, depicted by way of example of the principles of the invention.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
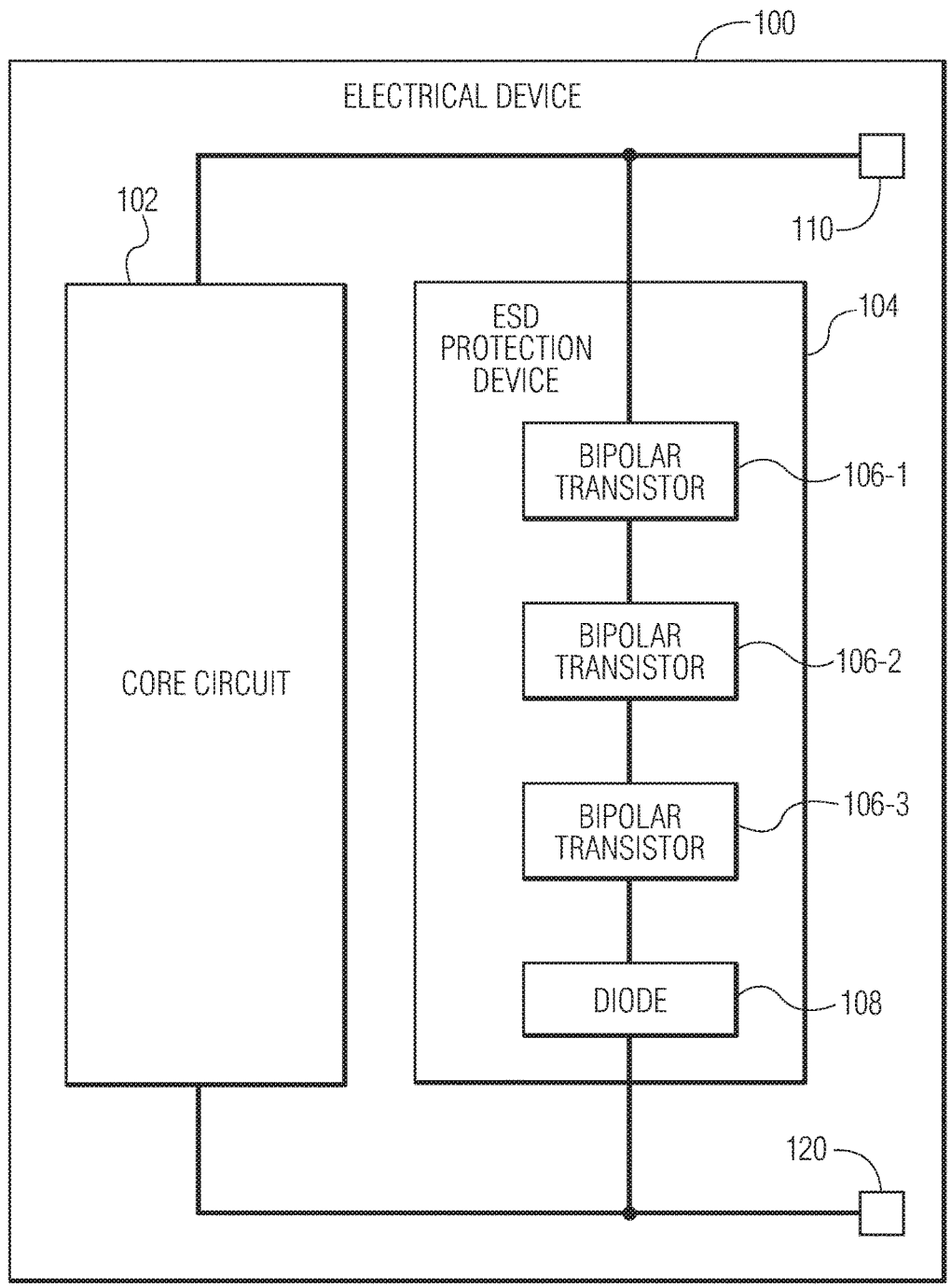
FIG. 1 is a schematic block diagram of an electrical device in accordance with an embodiment of the invention.

FIG. 1 is a schematic block diagram of an electrical device 100 in accordance with an embodiment of the invention. In the embodiment depicted in FIG. 1, the electrical device includes a core circuit 102 and an ESD protection device 104 that is used to protect the core circuit during an ESD event, which may be an ESD test or an actual ESD strike. The core circuit and the ESD protection device are both connected to first and second nodes 110, 120. The first and second nodes 110, 120 are coupled to different voltages. In some embodiments, the first node 110 is connected to a positive voltage and the second node 120 is connected to the ground or a voltage that is lower than the voltage at the first node 110. In an embodiment, the first and second nodes are electrical terminals, such as electrical pads or electrical pins.

The electrical device 100 can be used in various applications, such as automotive applications, communications applications, industrial applications, medical applications, computer applications, and/or consumer or appliance applications. In some embodiments, the electrical device is an IC device. For example, the electrical device can be implemented in a substrate, such as a semiconductor wafer or a printed circuit board (PCB). In some embodiments, the electrical device is included in a computing device, such as a smartphone, a tablet computer, a laptop, etc. For example, the electrical device may be included in a Near Field Communications (NFC) capable computing device. Although the electrical device is shown in FIG. 1 as including the core circuit 102 and the ESD protection device 104, in other embodiments, the electrical device may include additional circuit elements. For example, the electrical device may include a control circuit that is located in a low voltage domain and used to control the core circuit that is located in a high voltage domain.

The core circuit 102 is a device to be protected by the ESD protection device 104 in case of an ESD event, such as an ESD pulse received between the first and second nodes 110, 120. The core circuit typically includes one or more internal circuit components, such as transistors, capacitors, or diodes that are susceptible to ESD strikes. Examples of the core circuit include, but are not limited to, microcontrollers, transceivers, and switching circuits, which can be used for, for example, in vehicle control or communications, identification, wireless communications, and/or lighting control. In an embodiment, the core circuit is packaged as a semiconductor IC chip.

The ESD protection device 104 protects the core circuit 102 during an ESD event, such as an ESD pulse received between the first and second nodes 110, 120. The ESD protection device can be used to protect a power supply domain of the electrical device 100. For example, the ESD protection device may be connected to a power supply rail of the electrical device and shunt ESD current to protect the core circuit in response to an ESD pulse. The ESD protection device can be implemented by suitable semiconductor devices. In the embodiment depicted in FIG. 1, the ESD protection device includes three bipolar transistors 106-1, 106-2, 106-3 and a diode 108 that is connected in series with the three bipolar transistors and the second node 120. In some embodiments, the three bipolar transistors are connected in series between the first and second nodes 110, 120. The ESD protection device can operate with a triggering voltage of at least 30V. However, in other embodiments, the ESD protection device includes more than three bipolar transistors and/or more than one diode such that the triggering voltage can be extended. For example, a stack of four PNP bipolar transistors with one diode can result in a triggering voltage that is above 30 V.

The bipolar transistor 106-3 and the diode 108 may operate as a silicon controlled rectifier (SCR), such as an embedded SCR (eSCR). In an embodiment, the bipolar transistor 106-3 and the diode share a common substrate layer. In an example operation of the ESD protection device 104, the SCR formed by the bipolar transistor 106-3 and the diode can be activated in response to the trigger current creating a trigger voltage event (e.g., once the substrate receives enough current to activate the diode). In particular, once the trigger voltage has been reached for the ESD protection device 104, the SCR can enter a conducting (i.e., on state). The ESD protection circuit can then exit the conducting state (i.e., off state) once the holding current drops below a threshold value. In the conducting state, the SCR functions with a low voltage drop and low on resistance (relative to a bipolar transistor alone). The low voltage drop can result in a reduced snapback holding voltage, relative to a similar ESD protection circuit using a stacked bipolar transistor configuration without an SCR formed by a transistor and series diode combination. Current is then shunted through the series stack of bipolar transistors and the diode.

In the embodiment depicted in FIG. 1, to avoid latch up conditions, the snapback holding voltage of the ESD protection device 104 at which a breakdown condition occurs in the ESD protection device is above the operating voltage of the core circuit 102. For example, if the core circuit operates in a 30 V voltage domain, the snapback holding voltage of the ESD protection device is above 30 V to avoid latch up conditions. The trigger voltage at which the ESD protection device is activated to shunt ESD current is below the failure voltage of the core circuit. For example, if the core circuit suffers failure above 40V, the trigger voltage of the ESD protection device at which the ESD protection device is activated to shunt ESD current is less than 40V. In an embodiment, the amount that the snapback holding voltage of the ESD protection device is above the operating voltage of the core circuit can be increased to provide margin (e.g., to account for slight differences caused by processing variations). In addition, the amount that the trigger voltage of the ESD protection device is below the failure voltage of the core circuit can be adjusted (e.g., increased) to provide better ESD protection.

In some embodiments, the ESD protection device 104 also includes an active region that physically separates the three bipolar transistors and the diode. In some embodiments, the active region is a doped region, for example, an n-type doped region or a p-type doped region. The active region may be formed vertically with respect to (e.g., on top of) a substrate region. In some embodiments, the doping concentration of the active region is different from (e.g., higher than) the doping concentration of an underlying substrate region. The active region can create a smooth SCR path, and consequently, can lower the snapback holding voltage of the ESD protection device for a low operating voltage.

Figure 2:
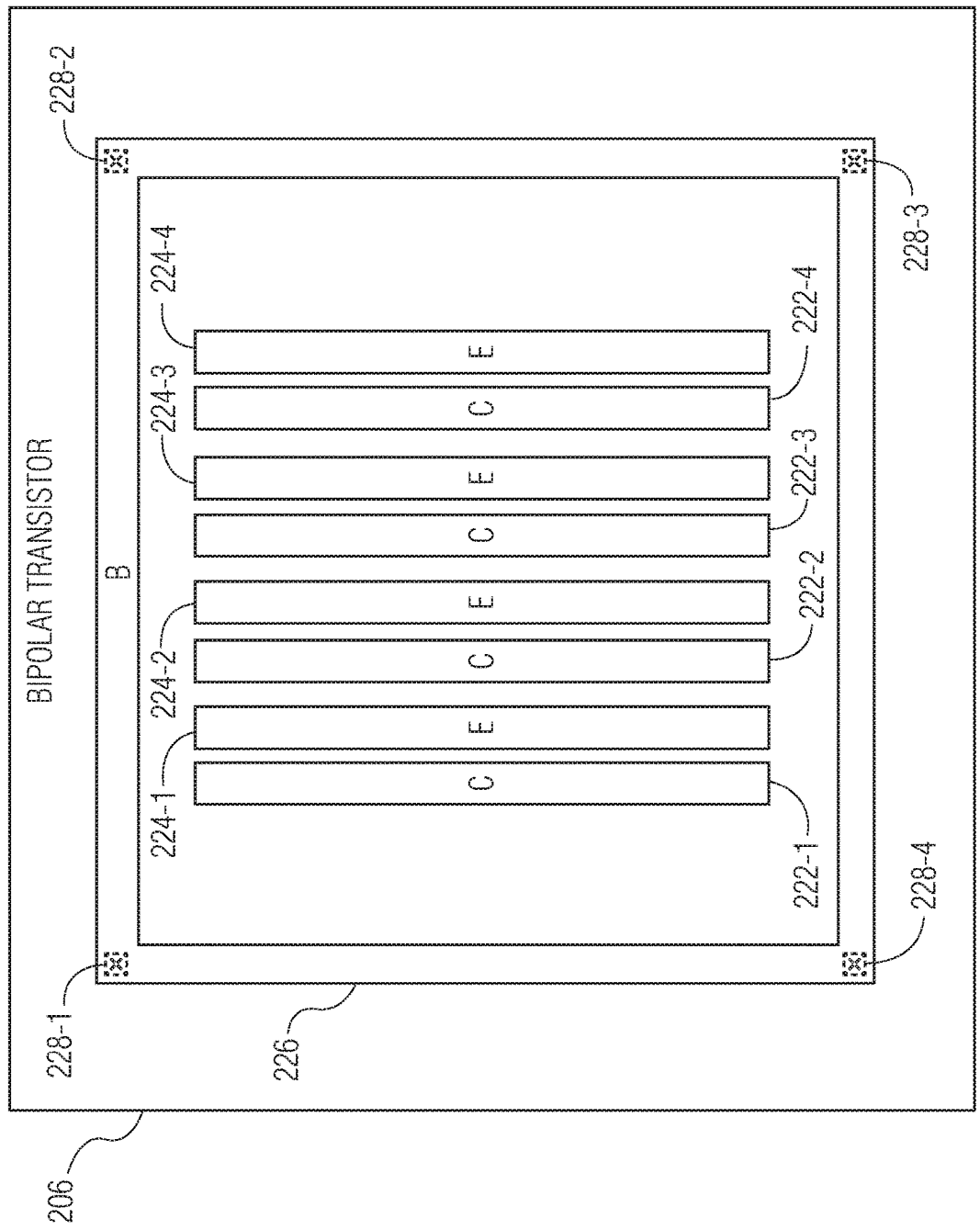
FIG. 2 depicts an embodiment of one of three bipolar transistors of an ESD protection device of the electrical device depicted in FIG. 1.

FIG. 2 depicts an embodiment of one of three bipolar transistors 106-1, 106-2, 106-3 of the ESD protection device 104 depicted in FIG. 1. In the embodiment depicted in FIG. 2, a bipolar transistor 206 includes a collector having four collector components 222-1, 222-2, 222-3, 222-4, an emitter having four emitter components 224-1, 224-2, 224-3, 224-4 that are alternately located with respect to the collector components, and a base structure 226 having at least one substrate region or at least one active region that surrounds the collector components and the emitter components. Compared to a bipolar transistor in which base contacts surround collector strips and emitter strips (For example, U.S. patent application Ser. No. 15/006,812, titled "ELECTROSTATIC DISCHARGE PROTECTION WITH INTEGRATED DIODE," filed on Jan. 26, 2016), the bipolar transistor 206 depicted in FIG. 2 has a larger effective base resistance. Consequently, the trigger voltage of the ESD protection device 104 depicted in FIG. 1 can be reduced. For example, the trigger voltage of the ESD protection device 104 depicted in Fig. may be 36V while the trigger voltage of an ESD protection device having a bipolar transistor in which base contacts surround collector strips and emitter strips is around 39V. In addition, compared to a bipolar transistor in which an additional horizontal emitter strip exists between collector/emitter strips and a base ring (For example, U.S. patent application Ser. No. 15/006,812, titled "ELECTROSTATIC DISCHARGE PROTECTION WITH INTEGRATED DIODE," filed on Jan. 26, 2016), the bipolar transistor 206 depicted in FIG. 2 does not have additional horizontal emitter strip between the collector/emitter strips and the base structure 226. Consequently, the snapback holding voltage of the ESD protection device 104 depicted in FIG. 1 can be increased. The bipolar transistor depicted in FIG. 2 is a possible implementation of the bipolar transistors of the ESD protection device 104 depicted in FIG. 1. However, the bipolar transistors of the ESD protection device depicted in FIG. 1 can be implemented differently from the bipolar transistor depicted in FIG. 2. For example, although the bipolar transistor is shown in FIG. 2 as including four collector components 222-1, 222-2, 222-3, 222-4 and four emitter components 224-1, 224-2, 224-3, 224-4, in other embodiments, the bipolar transistor may include more than or less than four collector components and/or more than or less than four emitter components.

In some embodiments, the base structure 226 includes a substrate region and multiple base contacts 228 located at corners of the base structure. For example, the base contacts may be implemented by metal layers or other conductive materials. In these embodiments, the bipolar transistor 206 is referred to as a Low Voltage Trigger (LVT) bipolar transistor because the trigger voltage of the ESD protection device 104 depicted in FIG. 1 is lower than the trigger voltage of an ESD protection device having a bipolar transistor in which base contacts completely surround collector strips and emitter strips. In an embodiment, the base structure includes a substrate region and only four base contacts 228-1, 228-2, 228-3, 228-4. In this embodiment, each of the four base contacts is located at a different corner of the base structure.

In some embodiments, the base structure 226 includes a substrate region and an active region but no base contact. In these embodiments, the bipolar transistor 206 is referred to as a floating base (FB) bipolar transistor because the base structure does not include base contacts. In an embodiment, the active region is located vertically with respect to the substrate region. For example, the active region may be located on top of the substrate region. In some embodiments, the base structure 226 includes a substrate region but no base contact and no active region.

Figure 3:
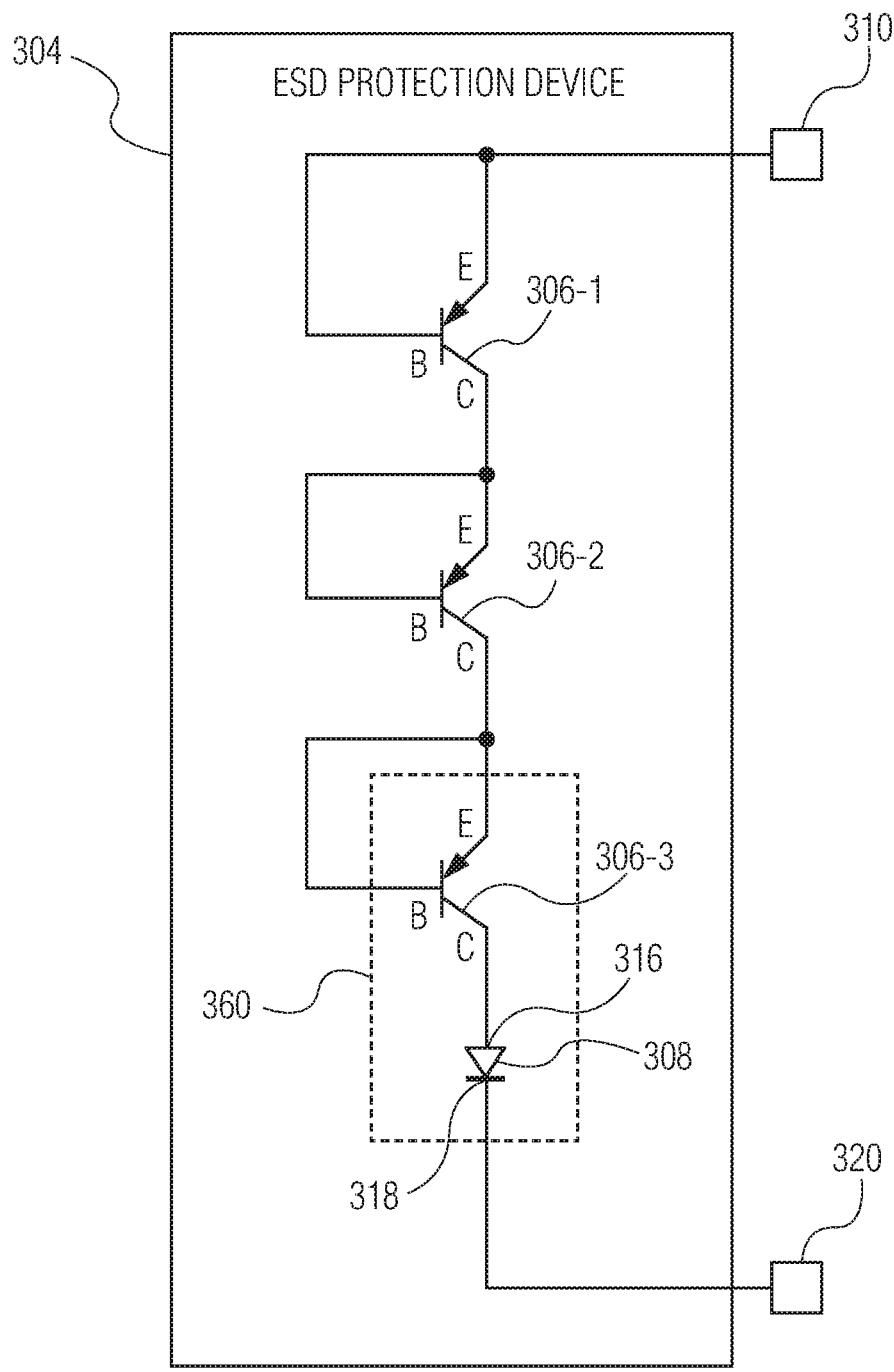
FIG. 3 depicts an embodiment of the ESD protection device depicted in FIG. 1 that has three PNP bipolar transistors.

In some embodiments, the three bipolar transistors 106-1, 106-2, 106-3 are PNP bipolar transistors. FIG. 3 depicts an embodiment of the ESD protection device 104 depicted in FIG. 1 that has three PNP bipolar transistors 306-1, 306-2, 306-3. In the embodiment depicted in FIG. 3, an ESD protection device 304 includes the three PNP bipolar transistors 306-1, 306-2, 306-3 and a PN diode 308 that are connected in series between nodes 310, 320. The ESD protection device 304 depicted in FIG. 3 is a possible implementation of the ESD protection device 104 depicted in FIG. 1. In particular, the three PNP bipolar transistors 306-1, 306-2, 306-3 are embodiments of the three bipolar transistors 106-1, 106-2, 106-3, while the PN diode 308 is an embodiment of the diode 108 depicted in FIG. 1. However, the ESD protection device depicted in FIG. 1 can be implemented differently from the ESD protection device depicted in FIG. 3. For example, one or more additional PNP bipolar transistors or PN diodes can be added in series in order to increase the trigger and snapback holding voltages relative to the operating voltage of the circuit being protected. Compared to adding additional PNP bipolar transistors, adding additional diodes can take up less substrate region. However, adding additional diodes can result in higher leakage currents.

In the embodiment depicted in FIG. 3, the base (B) and the emitter (E) of the PNP bipolar transistor 306-1 can be connected to node 310, which can be a positive voltage node. The collector (C) of the PNP bipolar transistor 306-1 can be connected to the base and to the emitter of the PNP bipolar transistor 306-2. The collector (C) of the PNP bipolar transistor 306-2 can be connected to the base (B) and to the emitter (E) of the PNP bipolar transistor 306-3. The collector (C) of the PNP bipolar transistor 306-3 can be connected to the anode 316 of the PN diode 308. The cathode 318 of the PN diode can be connected to a node 320, which can be a negative or ground voltage node.

In an example operation of the ESD protection device 304, when a positive ESD pulse is received to node 310, the ESD protection device shunts the ESD current from node 310 to node 320 if the ESD pulse exceeds the trigger voltage of the ESD protection device, which corresponds to a breakdown condition in the PNP bipolar transistors 306-1, 306-2, 306-3 and the PN diode 308 of the ESD protection device. In particular, the ESD protection device can be turned on due to part of the impact ionization current in the collector of the PNP bipolar transistor 306-3 reaching the substrate of the PNP bipolar transistor 306-3, which creates a potential/voltage difference in the substrate relative to the cathode 318 of the PN diode. When the potential difference is large enough, an NPN region (e.g., formed between n-type drift regions (i.e., Ndrift regions) of the PN diode and the PNP bipolar transistor 306-3) is turned on. Once the NPN region is turned on, the combination of the PNP bipolar transistor 306-3 and the PN diode form an embedded SCR (eSCR), which results in a reduced snapback holding voltage.

Figure 4A:
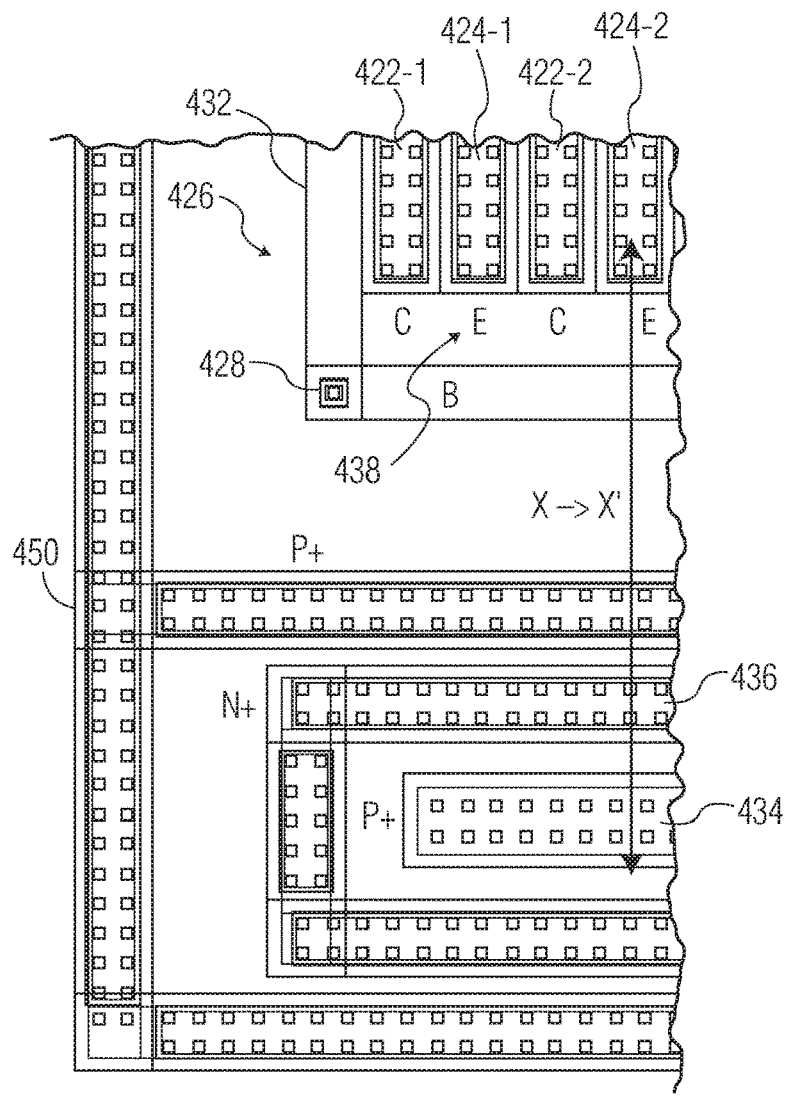
FIG. 4A depicts a top layout view of a section of a PNP bipolar transistor and a PN diode of the ESD protection device depicted in FIG. 3 in accordance with an embodiment of the invention.

FIG. 4A depicts a top layout view of a section 360 (shown in FIG. 3) of the PNP bipolar transistor 306-3 and the PN diode 308 depicted in FIG. 3 in accordance with an embodiment of the invention. In the layout view depicted in FIG. 4A, alternating collector strips 422-1, 422-2 and emitter strips 424-1, 424-2 are surrounded by a base ring 426 having a substrate region 432 and a base contact 428 located at a corner of the base ring. The PN diode includes a P+ region 434 that operates as the anode and an N+ region 436 that operates as the cathode. An optional P+ strip 450 can be added between the PNP bipolar transistor 306-3 and the PN diode 308 to facilitate current conduction when the eSCR formed by the PNP bipolar transistor 306-3 and the PN diode is in the on-state. The additional P+ strip may be electrically connected to the emitter strips through a wiring layer. The optional P+ strip can create a smooth SCR path, and consequently, can lower the snapback holding voltage for a lower operating voltage. In some embodiments, the collector strips may be connected to the anode of the PN diode while the emitter strips are connected to the cathode of the PN diode. From the anode of the PN diode, the current goes through the ndrift region to the cathode (N) of the PN diode. In some embodiments, the collector strip can be electrically connected to the anode (P) of the PN diode using a trace in a wiring layer (not shown). In addition, the collector strips may be connected together, for example, via a metal layer (not shown). As shown in the layout view depicted in FIG. 4A, a gap 438 exists between the emitter strips and the base ring. The non-abutted emitter/base layout can decrease the snapback holding voltage, compared to an abutted emitter/base layout. For example, the gap between the base ring and the emitter strip can introduce a large N-type well resistance, which results in a smaller snapback holding voltage. In the layout view depicted in FIG. 4A, the PNP bipolar transistor 306-3 can be referred to as a low trigger voltage PNP (LVTPNP)-eSCR transistor because the trigger voltage of the PNP bipolar transistor 306-3 is lower than the trigger voltage of a PNP bipolar transistor in which base contacts surround collector strips and emitter strips.

Figure 4B:
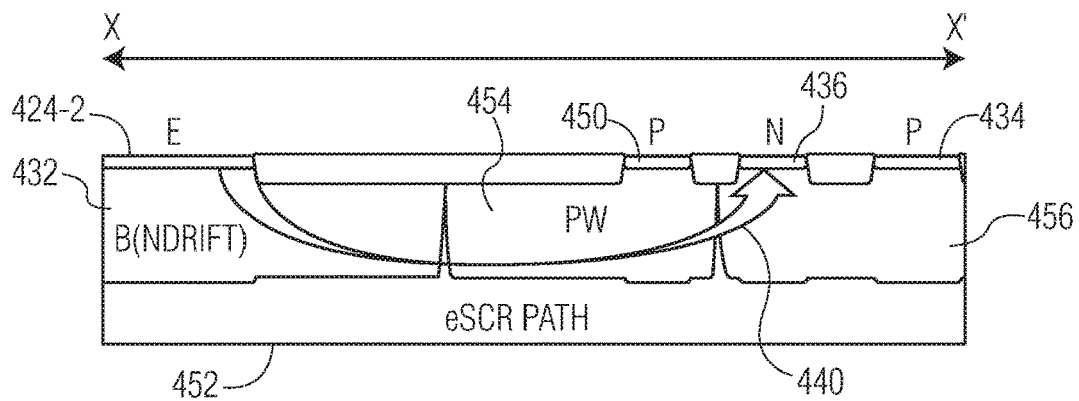
FIG. 4B depicts a cross sectional view of the section of the PNP bipolar transistor and the PN diode depicted in FIG. 4A.

FIG. 4B depicts a cross sectional view of the section 360 (shown in FIG. 3) of the PNP bipolar transistor 306-3 and the PN diode 308 depicted in FIG. 4A at the location indicated by the dashed arrow from X to X'. In the X-X' cross-sectional view, there is no B contact because the base contact 428 is located in the corner of the base ring 426. As depicted in FIG. 4B, the substrate region 432 of the base ring is an n-type drift region (i.e., ndrift region) that is formed on top of a substrate layer 452, which can be an epitaxial film, an epitaxial layer, or any other suitable substrate structure. A p-well region (PW) 454 separates the PNP bipolar transistor 306-3 and the PN diode 308. The cathode (N) 436 of the PN diode and the anode (P) 434 of the PN diode are located on top an ndrift region 456, which is formed on top of the substrate layer. Compared to a transistor layout in which base contacts surround collector strips and emitter strips, the effective base resistance of the layout depicted in FIGS. 4A and 4B is larger, and consequently, the trigger voltage of the PNP bipolar transistor 306-3 is reduced. In an example operation of the eSCR formed by the PN diode and the PNP bipolar transistor 306-3, during a positive ESD event, ESD current flows sequentially through the series connected PNP devices and through the PN diode when the ESD voltage is high enough to trigger the PNP bipolar transistors. The trigger mechanism causes part of the impact ionization current in the collector of the PNP bipolar transistor 306-3 to reach the substrate and to exit/dissipate through a substrate contact. When a sufficient potential difference builds up between the substrate layer 452 and the cathode (N) of the PN diode, the eSCR formed by the PNP bipolar transistor 306-3 and the PN diode begins conducting through the current path labeled as the eSCR path 440.

Figure 5A:
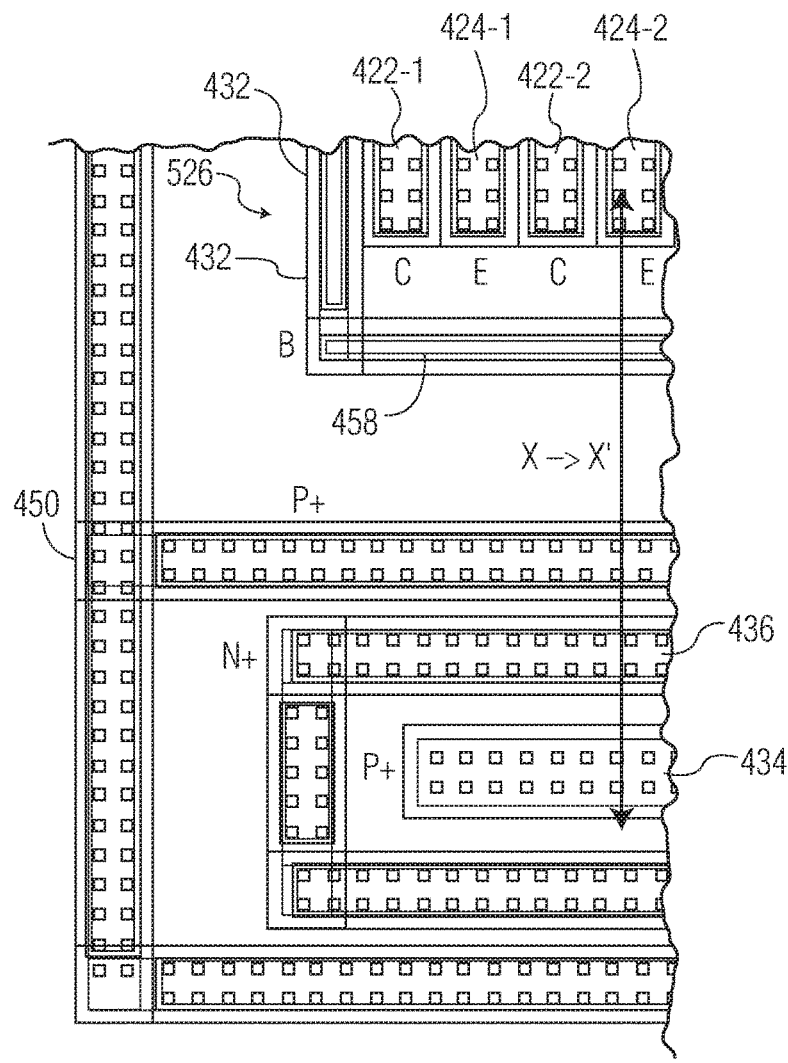
FIG. 5A depicts a top layout view of a section of a PNP bipolar transistor and a PN diode of the ESD protection device depicted in FIG. 3 in accordance with another embodiment of the invention.

FIG. 5A depicts a layout view of a section 360 (shown in FIG. 3) of the PNP bipolar transistor 306-3 and the PN diode 308 depicted in FIG. 3 in accordance with another embodiment of the invention. In the layout view depicted in FIG. 5A, alternating collector strips 422-1, 422-2 and emitter strips 424-1, 424-2 are surrounded by a base ring 526 having the substrate region 432 and an active region 458 that overlaps with the substrate region. In the layout view depicted in FIG. 5A, the PNP bipolar transistor 306-3 can be referred to as a floating base PNP (FBPNP)-eSCR transistor because the base ring does not include a base contact. In some embodiments, the active region is a doped region, for example, an n-type doped region. The active region may be formed vertically with respect to (e.g., on top of) the substrate region. In some embodiments, the doping concentration of the active region is different from (e.g., higher than) the doping concentration of the underlying substrate region.

Figure 5B:
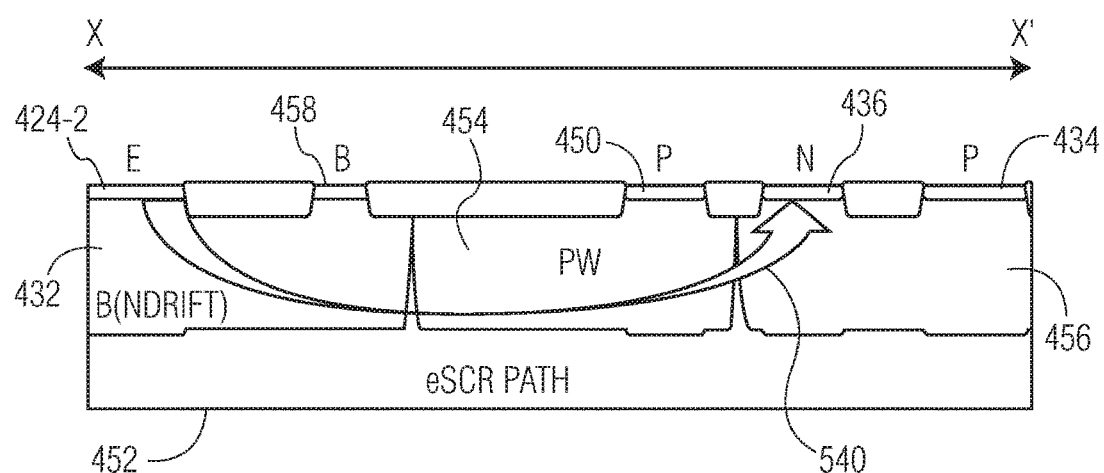
FIG. 5B depicts a cross sectional view of the section of the PNP bipolar transistor and the PN diode depicted in FIG. 5A.

FIG. 5B depicts a cross sectional view of the section 360 (shown in FIG. 3) of the PNP bipolar transistor 306-3 and the PN diode 308 depicted in FIG. 5A at the location indicated by the dashed arrow from X to X'. In the X-X' cross-sectional view, the active region 458 of the base ring is located on top of the substrate region 432 of the base ring 526. As depicted in FIG. 5B, the cross sectional view shows no B contact because the base ring does not include any base contact. The eSCR formed by the PNP bipolar transistor 306-3 and the PN diode conducts ESD current through the current path labeled as the eSCR path 540. Compared to a transistor layout in which base contacts surround collector strips and emitter strips, the effective base resistance of the layout depicted in FIGS. 5A and 5B is larger, and consequently, the trigger voltage of the PNP bipolar transistor 306-3 is reduced.

Figure 6A:
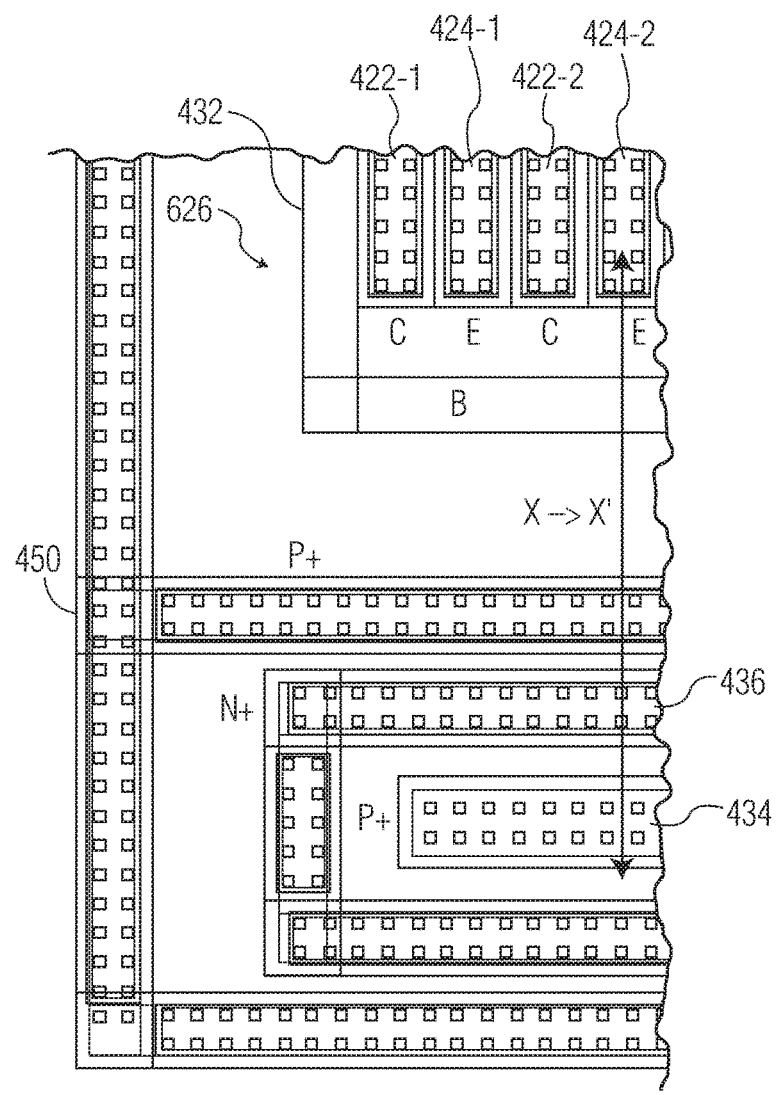
FIG. 6A depicts a top layout view of a section of a PNP bipolar transistor and a PN diode of the ESD protection device depicted in FIG. 3 in accordance with another embodiment of the invention.

FIG. 6A depicts a layout view of a section 360 (shown in FIG. 3) of the PNP bipolar transistor 306-3 and the PN diode 308 depicted in FIG. 3 in accordance with another embodiment of the invention. In the layout view depicted in FIG. 6A, alternating collector strips 422-1, 422-2 and emitter strips 424-1, 424-2 are surrounded by a base ring 626 having only the substrate region 432. In the layout view depicted in FIG. 6A, the PNP bipolar transistor 306-3 can be referred to as a FBPNP-eSCR transistor because the base ring does not include a base contact.

Figure 6B:
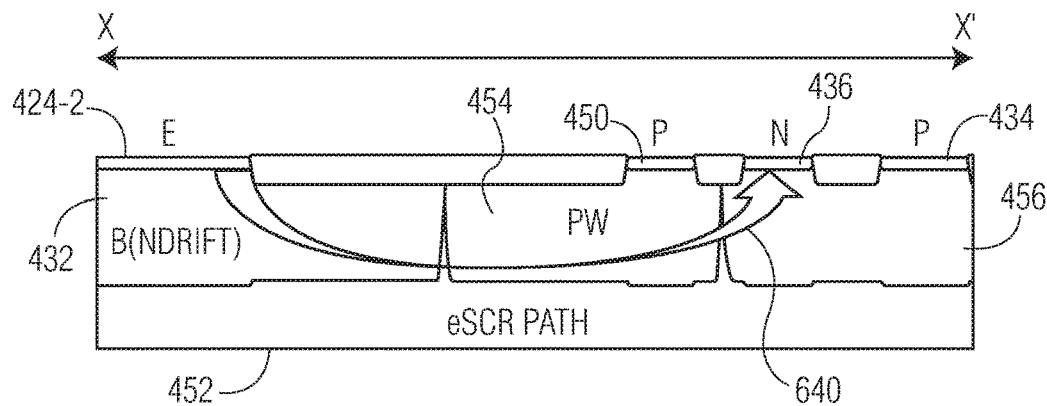
FIG. 6B depicts a cross sectional view of the section of the PNP bipolar transistor and the PN diode depicted in FIG. 6A.

FIG. 6B depicts a cross sectional view of the section of the PNP bipolar transistor 306-3 and the PN diode 308 depicted in FIG. 6A at the location indicated by the dashed arrow from X to X'. As depicted in FIG. 6B, the cross sectional view shows no B contact because the base ring 626 does not include a base contact. The eSCR formed by the PNP bipolar transistor 306-3 and the PN diode conducts ESD current through the current path labeled as the eSCR path 640. Compared to a transistor layout in which base contacts surround collector strips and emitter strips, the effective base resistance of the layout depicted in FIGS. 6A and 6B is larger, and consequently, the trigger voltage of the PNP bipolar transistor 306-3 is reduced.

Figure 7:
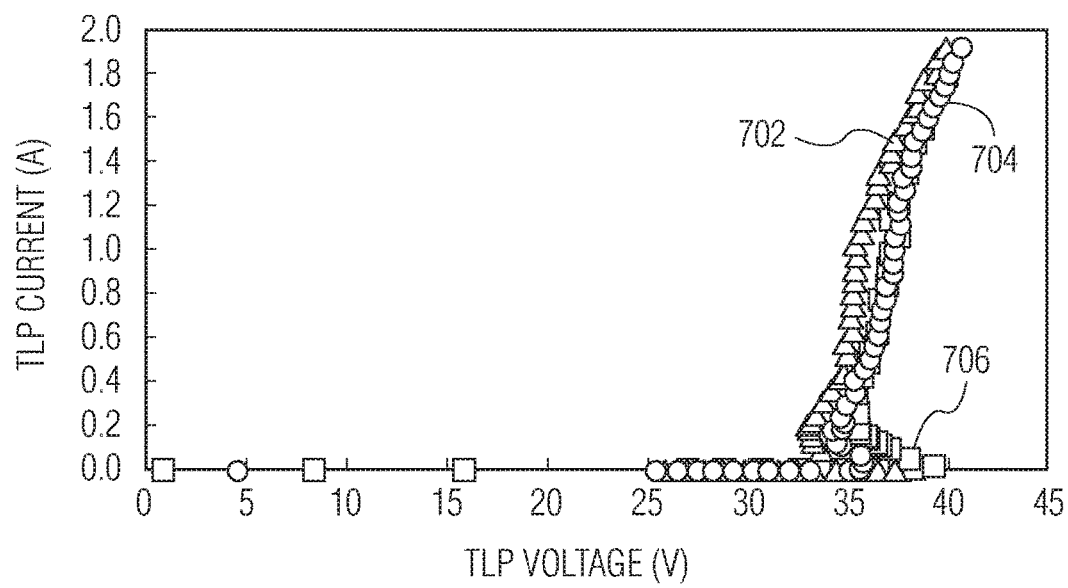
FIG. 7 is a graph of transmission line pulse (TLP) measurements for a three-stack PNP ESD protection device, a three-stack low trigger voltage PNP (LVTPNP)-embedded silicon controlled rectifier (eSCR) ESD protection device in accordance with an embodiment of the invention, and a three-stack floating base PNP (FBPNP)-eSCR ESD protection device in accordance with an embodiment of the invention.

FIG. 7 is a graph of TLP measurements for a three-stack PNP ESD protection device, a three-stack LVTPNP-eSCR ESD protection device in accordance with an embodiment of the invention, and a three-stack FBPNP-eSCR ESD protection device in accordance with an embodiment of the invention. For the graph shown in FIG. 7, the TLP measurements are carried out using 100 ns TLP characteristics. The trace 706 for three-stack PNP ESD protection device shows a trigger voltage of around 39V. In comparison, the trigger voltages of the three-stack LVTPNP-eSCR ESD protection device and the three-stack FBPNP-eSCR ESD protection device are lower than the trigger voltage of three-stack PNP ESD protection device. In particular, the trace 702, of the three-stack LVTPNP-eSCR ESD protection device shows a trigger voltage of around 37V and the trace 704, of the three-stack FBPNP-eSCR ESD protection device shows a trigger voltage of around 36V.

Figure 8:
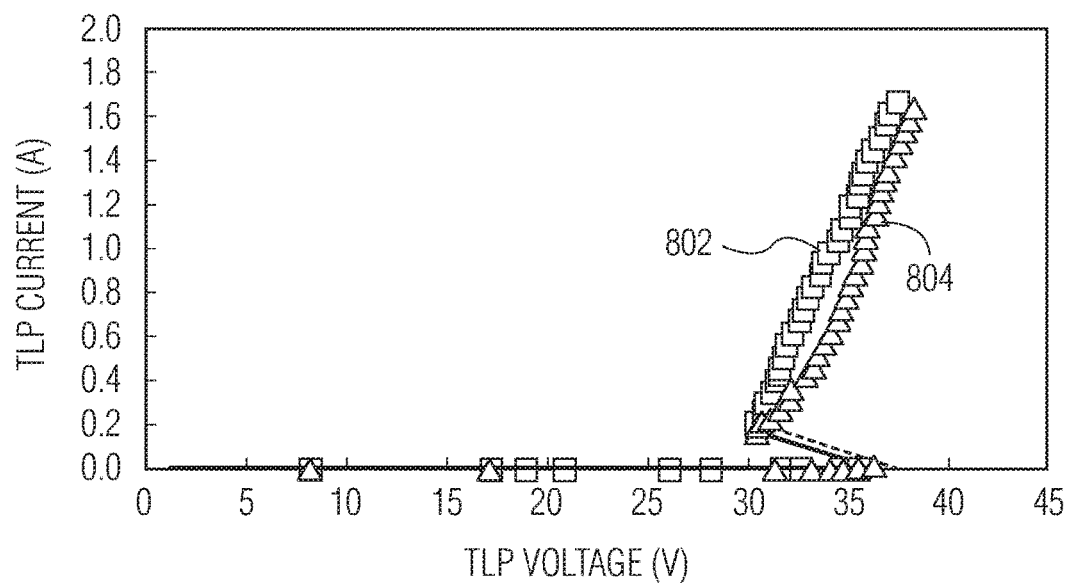
FIG. 8 is a graph of TLP measurements under high temperature for a three-stack LVTPNP-eSCR ESD protection device in accordance with an embodiment of the invention and a three-stack FBPNP-eSCR ESD protection device in accordance with an embodiment of the invention.

FIG. 8 is a graph of TLP measurements under high temperature (e.g., 150° C.) for a three-stack LVTPNP-eSCR ESD protection device in accordance with an embodiment of the invention and a three-stack FBPNP-eSCR ESD protection device in accordance with an embodiment of the invention. As shown in FIG. 8, the trace 802 for the three-stack LVTPNP-eSCR ESD protection device and the trace 804 for the three-stack FBPNP-eSCR ESD protection device show that the snapback holding voltages ($V_H$) of the three-stack LVTPNP-eSCR ESD protection device and the three-stack FBPNP-eSCR ESD protection device are higher than the operating voltage of the core circuit 102, which is, for example, 30V.

Figure 9:
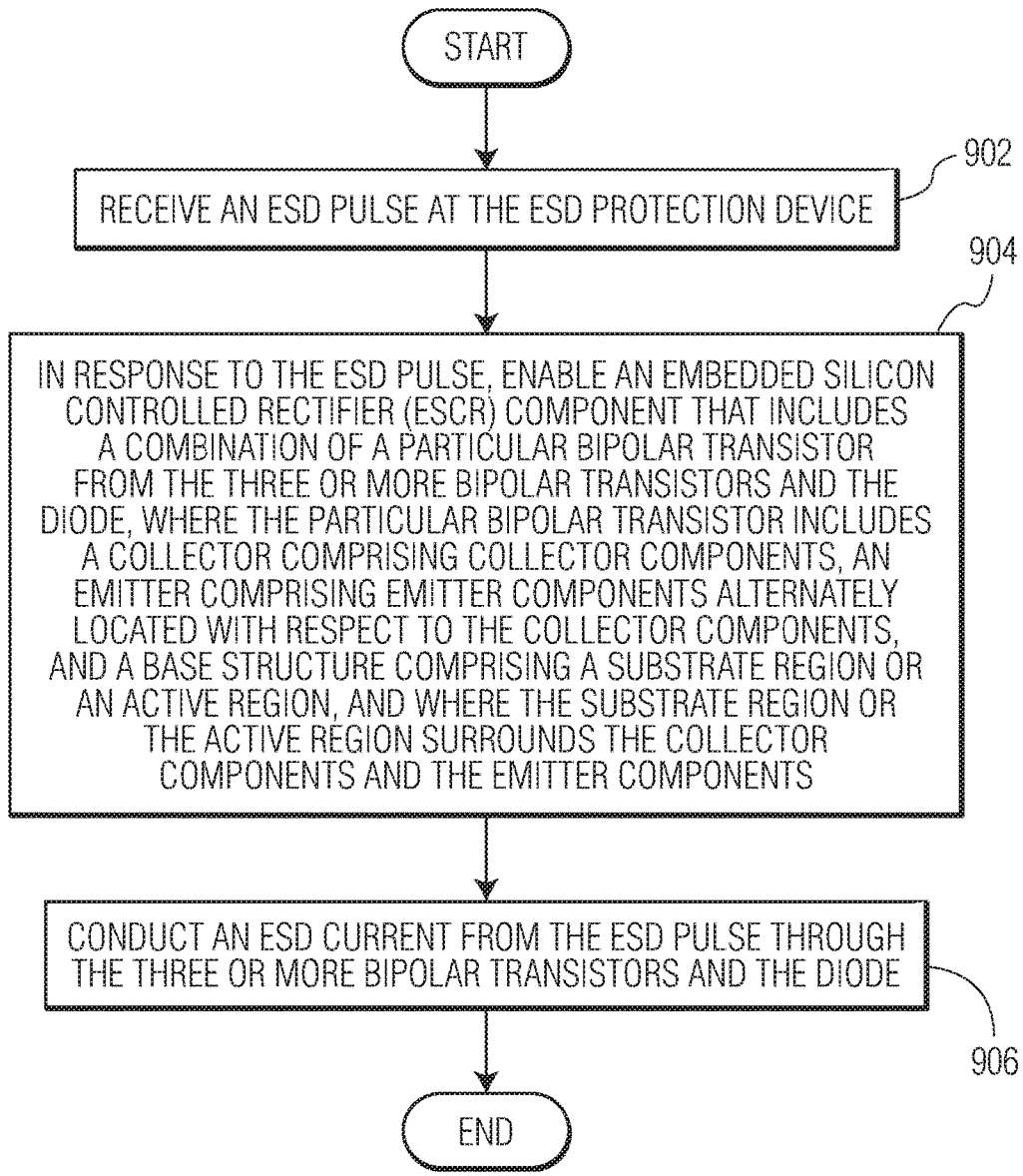
FIG. 9 is a process flow diagram that illustrates a method for operating an electrostatic discharge (ESD) protection device in accordance with an embodiment of the invention.

FIG. 9 is a process flow diagram that illustrates a method for operating an ESD protection device in accordance with an embodiment of the invention. The ESD protection device includes three or more bipolar transistors and a diode connected in series with the three or more bipolar transistors. At block 902, an ESD pulse is received at the ESD protection device. At block 904, in response to the ESD pulse, an eSCR component that includes a combination of a particular bipolar transistor from the three or more bipolar transistors and the diode is enabled. The particular bipolar transistor includes a collector comprising collector components, an emitter comprising emitter components alternately located with respect to the collector components, and a base structure comprising a substrate region or an active region. The substrate region or the active region surrounds the collector components and the emitter component. At block 906, an ESD current from the ESD pulse is conducted through the three or more bipolar transistors and the diode. The ESD protection device may be the same as or similar to the ESD protection device 104 depicted in FIG. 1 and/or the ESD protection device 304 depicted in FIG. 3.

Although the operations of the method herein are shown and described in a particular order, the order of the operations of the method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In addition, although specific embodiments of the invention that have been described or depicted include several components described or depicted herein, other embodiments of the invention may include fewer or more components to implement less or more features.

Furthermore, although specific embodiments of the invention have been described and depicted, the invention is not to be limited to the specific forms or arrangements of parts so described and depicted. The scope of the invention is to be defined by the claims appended hereto and their equivalents.

What is claimed is:

1. An electrostatic discharge (ESD) protection device, the ESD protection device comprising:
   three or more bipolar transistors that are configured to shunt current between a first node and a second node in response to an ESD pulse received between the first and second nodes, wherein each of the three or more bipolar transistors comprises:
      a collector comprising a plurality of collector components;
      an emitter comprising a plurality of emitter components, wherein the emitter components are alternately located with respect to the collector components; and
      a base structure comprising a base ring, wherein the base ring comprises a substrate region, wherein the substrate region of the base ring surrounds the collector components and the emitter components; and
   a diode connected in series with the three or more bipolar transistors and one of the first and second nodes.

2. The ESD protection device of claim 1, wherein the base structure comprises the substrate region, and wherein the base structure further comprises a plurality of base contacts located at corners of the base structure.

3. The ESD protection device of claim 1, wherein the base structure comprises the substrate region, wherein the base structure further comprises only four base contacts, and wherein each of the four base contacts is located at a different corner of the base structure.

4. The ESD protection device of claim 1, wherein the base structure comprises the substrate region and an active region, wherein the active region is located vertically with respect to the substrate region, and wherein the base structure comprises no base contact.

5. The ESD protection device of claim 1, wherein the base structure comprises the substrate region, and wherein the base structure comprises no base contact and no active region.

6. The ESD protection device of claim 1, wherein the three or more bipolar transistors are connected in series between the first and second nodes.

7. The ESD protection device of claim 1, wherein the three or more bipolar transistors comprise PNP bipolar transistors.

8. The ESD protection device of claim 4, further comprising a second active region that physically separates the three or more bipolar transistors and the diode.

9. The ESD protection device of claim 1, wherein the diode and one of the three or more bipolar transistors operate as a silicon controlled rectifier (SCR).

10. The ESD protection device of claim 8, wherein the diode and the one of the three or more bipolar transistors share a substrate layer.

11. An electrostatic discharge (ESD) protection device, the ESD protection device comprising:
    three or more PNP bipolar transistors connected in series that are configured to shunt current between a first node and a second node in response to an ESD pulse received between the first and second nodes, wherein each of the three or more PNP bipolar transistors comprises:
       a collector comprising a plurality of collector components;
       an emitter comprising a plurality of emitter components, wherein the emitter components are alternately located with respect to the collector components; and
       a base structure comprising a base ring, wherein the base ring comprises a substrate region, wherein the substrate region of the base ring surrounds the collector components and the emitter components; and
    a diode connected in series with the three or more bipolar transistors and one of the first and second nodes, wherein the diode and one of the three or more PNP bipolar transistors operate as a silicon controlled rectifier (SCR).

12. The ESD protection device of claim 11, wherein the base structure comprises the substrate region, and wherein the base structure further comprises a plurality of base contacts located at corners of the base structure.

13. The ESD protection device of claim 11, wherein the base structure comprises the substrate region, wherein the base structure further comprises only four base contacts, and wherein each of the four base contacts is located at a different corner of the base structure.

14. The ESD protection device of claim 11, wherein the base structure comprises the substrate region and an active region, wherein the active region is located vertically with respect to the substrate region, and wherein the base structure comprises no base contact.

15. The ESD protection device of claim 11, wherein the base structure comprises the substrate region, and wherein the base structure comprises no base contact and no active region.

16. The ESD protection device of claim 14, further comprising a second active region that physically separates the three or more bipolar transistors and the diode.

17. A method for operating an electrostatic discharge (ESD) protection device, wherein the ESD protection device comprises three or more bipolar transistors and a diode connected in series with the three or more bipolar transistors, the method comprising:
    receiving an ESD pulse at the ESD protection device;
    in response to the ESD pulse, enabling an embedded silicon controlled rectifier (eSCR) component that includes a combination of a particular bipolar transistor from the three or more bipolar transistors and the diode, wherein the particular bipolar transistor comprises a collector comprising a plurality of collector components, an emitter comprising a plurality of emitter components alternately located with respect to the collector components, and a base structure comprising a base ring, wherein the base ring comprises a substrate region, and wherein the substrate region of the base ring surrounds the collector components and the emitter components; and
    conducting an ESD current from the ESD pulse through the three or more bipolar transistors and the diode.

18. The method of claim 17, wherein the base structure comprises the substrate region, and wherein the base structure further comprises a plurality of base contacts located at corners of the base structure.

19. The method of claim 17, wherein the base structure comprises the substrate region and an active region, wherein the active region is located vertically with respect to the substrate region, and wherein the base structure comprises no base contact.

20. The method of claim 17, wherein the base structure comprises the substrate region, and wherein the base structure comprises no base contact and no active region.

* * * * *